US010699973B2

(12) United States Patent
Stamper et al.

(10) Patent No.: US 10,699,973 B2
(45) Date of Patent: Jun. 30, 2020

(54) SEMICONDUCTOR TEST STRUCTURE AND METHOD FOR FORMING THE SAME

(71) Applicant: GLOBALFOUNDRIES Inc., Grand Cayman (KY)

(72) Inventors: Anthony K. Stamper, Burlington, VT (US); Patrick S. Spinney, Charlotte, VT (US); Jeffrey C. Stamm, Colchester, VT (US)

(73) Assignee: GLOBALFOUNDERS INC., Grand Cayman (KY)

( * ) Notice: Subject to any disclaimer, the term of this patent is extended or adjusted under 35 U.S.C. 154(b) by 0 days.

(21) Appl. No.: 15/804,165

(22) Filed: Nov. 6, 2017

(65) Prior Publication Data
US 2019/0139841 A1 May 9, 2019

(51) Int. Cl.
*H01L 23/544* (2006.01)
*H01L 23/00* (2006.01)
*H01L 21/66* (2006.01)
*H01L 21/78* (2006.01)

(52) U.S. Cl.
CPC .............. *H01L 22/32* (2013.01); *H01L 21/78* (2013.01); *H01L 22/30* (2013.01); *H01L 22/34* (2013.01); *H01L 23/544* (2013.01); *H01L 23/562* (2013.01); *H01L 2223/5446* (2013.01)

(58) Field of Classification Search
CPC ......... H01L 22/30; H01L 22/32; H01L 22/34; H01L 23/544; H01L 23/562
See application file for complete search history.

(56) References Cited

U.S. PATENT DOCUMENTS

| 9,728,474 | B1 | 8/2017 | Yi et al. | |
| 2003/0215966 | A1* | 11/2003 | Rolda, Jr. | H01L 22/32 438/18 |
| 2006/0278956 | A1* | 12/2006 | Cadouri | H01L 21/78 257/620 |
| 2007/0023915 | A1* | 2/2007 | Jao | G01R 31/2884 257/758 |
| 2009/0098712 | A1 | 4/2009 | Taguchi et al. | |

FOREIGN PATENT DOCUMENTS

| TW | 200302528 A | 8/2003 |
| TW | 200929469 A | 7/2009 |

OTHER PUBLICATIONS

Examination Report and English Translation thereof for Taiwanese Patent Application No. 107117527 dated Jul. 19, 2019, 16 pages.

* cited by examiner

*Primary Examiner* — Thanhha S Pham
(74) *Attorney, Agent, or Firm* — Anthony Canale; Hoffman Warnick LLC

(57) ABSTRACT

A test structure for semiconductor chips of a wafer, and the method of forming the same is included. The test structure may include a first portion disposed within a corner area of a first chip on the wafer, and at least another portion disposed within another corner of another chip on the wafer, wherein before dicing of the chips, the portions form the test structure. The test structure may include an electronic test structure or an optical test structure. The electronic test structure may include probe pads, each probe pad positioned across two or more corner areas of two or more chips. The corner areas including the test structures disposed therein may be removed from the chips during a dicing of the chips.

7 Claims, 7 Drawing Sheets

SEMICONDUCTOR TEST STRUCTURE AND METHOD FOR FORMING THE SAME

BACKGROUND

Technical Field

The present disclosure relates to semiconductor structures, and more particularly to test structures, such as optical and electronic test structures for testing semiconductor chips.

Related Art

Conventional semiconductor chips are made up of millions of transistors, and other structures such as capacitors, resistors, diodes, etc. Although initially formed as isolated structures, the devices are interconnected together to form functional circuits. Interconnection of the devices may be achieved through the use of lateral interconnections referred to as metal wires, and vertical interconnections referred to as vias and contacts. Bond pads are subsequently formed above the interconnect structures of each respective semiconductor chip to allow electrical connection to the devices of the chip. For example, electrical connections may be made through the bond pads to connect each semiconductor chip to a package substrate or another semiconductor chip. Semiconductor chips may be used in a wide range of applications such as cellular phones, computers, etc.

Conventional integrated circuit (IC) (i.e., semiconductor chip) formation generally occurs on the surface of a semiconductor material, e.g., a wafer. The wafer may include a number of chips thereon. The chips may be separated from one another on the surface of the silicon wafer by regions referred to as scribe lanes. A number of steps are involved in fabrication of the individual structures used to create the electronic components of the chips. These steps are not described in detail herein, but involve the deposition of various layers of material which may be selectively removed (e.g., by chemical etching) to create the structures of the electronic components. Eventually, once the fabrication and testing processes are complete, each chip will be separated and packaged to become an individual semiconductor packaged chip.

Due to the large number of processing steps and wide range of processing variables encountered during the fabrication of a conventional device, chips may be electrically and/or optically tested before being completely separated into individual semiconductor chips. For example, each chip may be electrically tested for electrical shorts, opens, resistance, etc. In another example, each chip may be optically tested for structure alignment, overlay, critical dimension, etc. Directly testing the chips may cause damage to components of the chips which may render the chips inoperable. For example, if the chip pads are probed, the metal may be damaged and the subsequent solder bumps, copper pillars, or wire bonds formed thereon may not be functional. Therefore, it is conventional to include test structures to facilitate the monitoring of the process and testing of complete wafers without damaging the chip components. Optical and electronic test structures are conventionally formed in regions referred to as "knockout" areas, i.e., regions of the wafer which would otherwise be devices. Knockout areas may include the scribe lanes, or a steal primary chip, i.e., a portion of the wafer where a functional semiconductor chip could have otherwise been formed. As integrated circuits (ICs) become more complicated, the number of necessary test structures has significantly increased, as has the space required to accommodate such structures. The increasing wafer space required for incorporating test structures, i.e., knockout areas, imposes a limitation on the number of chips which may be formed on the wafer.

After testing, the chips may be separated from one another to form individual semiconductor chips which then may be packaged. Separation of chips to form individual semiconductor chips is generally referred to as singulation or dicing of the chips. One example of dicing may include through-wafer cutting within the scribe lanes on the wafer by a mechanical saw or laser. Another example of dicing may include the formation of partial cuts in the scribe lanes by a mechanical saw or laser, and subsequent breaking apart of the chips along the partial cuts. One challenge associated with dicing includes the metal debris released by dicing through scribe lanes which may include metal test structures as described above. The metal debris may settle on the walls of the semiconductor chips which may, for example, cause slow grow cracks to form and eventually cause delamination of the chip. Another challenge of dicing is that the scribe lane needs to be approximately 50 or more microns wide, to allow for room to saw or laser dice without damaging the active chip. Another challenge associated with dicing includes stress induced defects such as cracks and delamination. Stress induced defects are likely to occur near chip corners where susceptibility to chip failure from such defects is highest. Chip corners are therefore conventionally formed to be vacant of functional semiconductor structures which may result in wasted space on the wafer. Conventional techniques for mitigating the damage caused by stress includes providing a chip layout having a sloped or chamfered corner area rather than a chip layout having a sharp (i.e., 90 degree) corner.

SUMMARY

A first aspect of the disclosure is directed to a method for a semiconductor wafer including a plurality of semiconductor chips, wherein each semiconductor chip includes: an active area including a plurality of integrated circuit (IC) structures; a corner area of the semiconductor chip that is outside of the active area; and a portion of a test structure disposed within the corner area, wherein the portion of the test structure is configured to contact at least one other portion of the test structure disposed in another corner area of another semiconductor chip of the semiconductor wafer to form the test structure.

A second aspect of the disclosure is related to a semiconductor chip including: an active area including a plurality of integrated circuit (IC) structures; a corner area of the semiconductor chip that is outside of the active area; and a portion of a test structure disposed within the corner area, wherein the portion of the test structure contacts another portion of the test structure disposed within another corner area of another semiconductor chip to form a test structure, prior to separation of the semiconductor chips.

A third aspect of the disclosure is related to method of forming a test structure for a semiconductor wafer, the method including: forming a first partial test structure in a first corner area of a first semiconductor chip of the semiconductor wafer; and forming a second partial test structure in a second corner area of a second adjacent semiconductor chip of the semiconductor wafer, wherein the second partial test structure contacts at least the first partial test structure to form the test structure.

The foregoing and other features of the disclosure will be apparent from the following more particular description of the embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific embodiments in which the present teachings may be practiced. These embodiments are described in sufficient detail to enable those skilled in the art to practice the present teachings and it is to be understood that other embodiments may be used and that changes may be made without departing from the scope of the present teachings. The following description is, therefore, merely illustrative.

Embodiments of the present disclosure provide a test structure including portions thereof disposed within and extending between multiple corner areas of semiconductor chips of a wafer. A method of forming the test structure may include forming a first portion of the test structure in a first corner area of a first chip on a wafer, and forming at least one additional portion in another corner area of at least one other neighboring chip on the wafer. The portions may be configured to contact one another to form the final test structure. Embodiments of the disclosure may increase the space available on a wafer for forming semiconductor chips. By forming a single test structure across two or more chip corners, embodiments of the present disclosure may allow for increased area for larger test structures and/or allow for more representative test structures to be formed.

Figure 1:
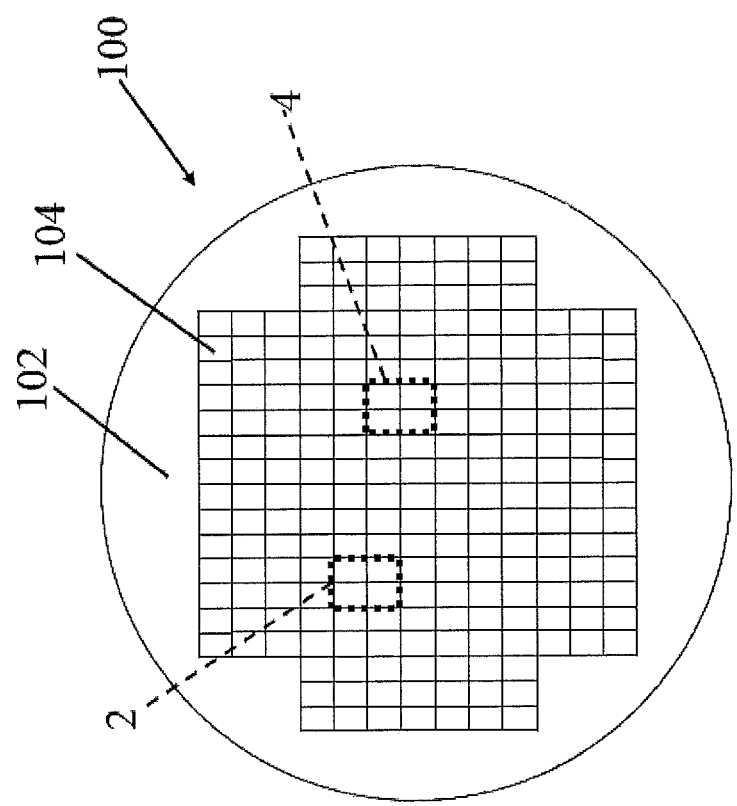
FIG. 1 shows a plan view of a semiconductor wafer including semiconductor chips, according to embodiments of the disclosure.

Turning to the figures, FIG. 1 shows a plan view of a wafer 100 for forming semiconductor chips. Wafer 100 may include, for example, a silicon wafer formed by conventional semiconductor fabrication techniques. As shown in FIG. 1, an upper surface 102 of wafer 100 is subdivided into a number of die or semiconductor chips (i.e., chips) 104. Wafer 100 may eventually be diced to separate chips 104 into individual semiconductor chips.

Figure 2:
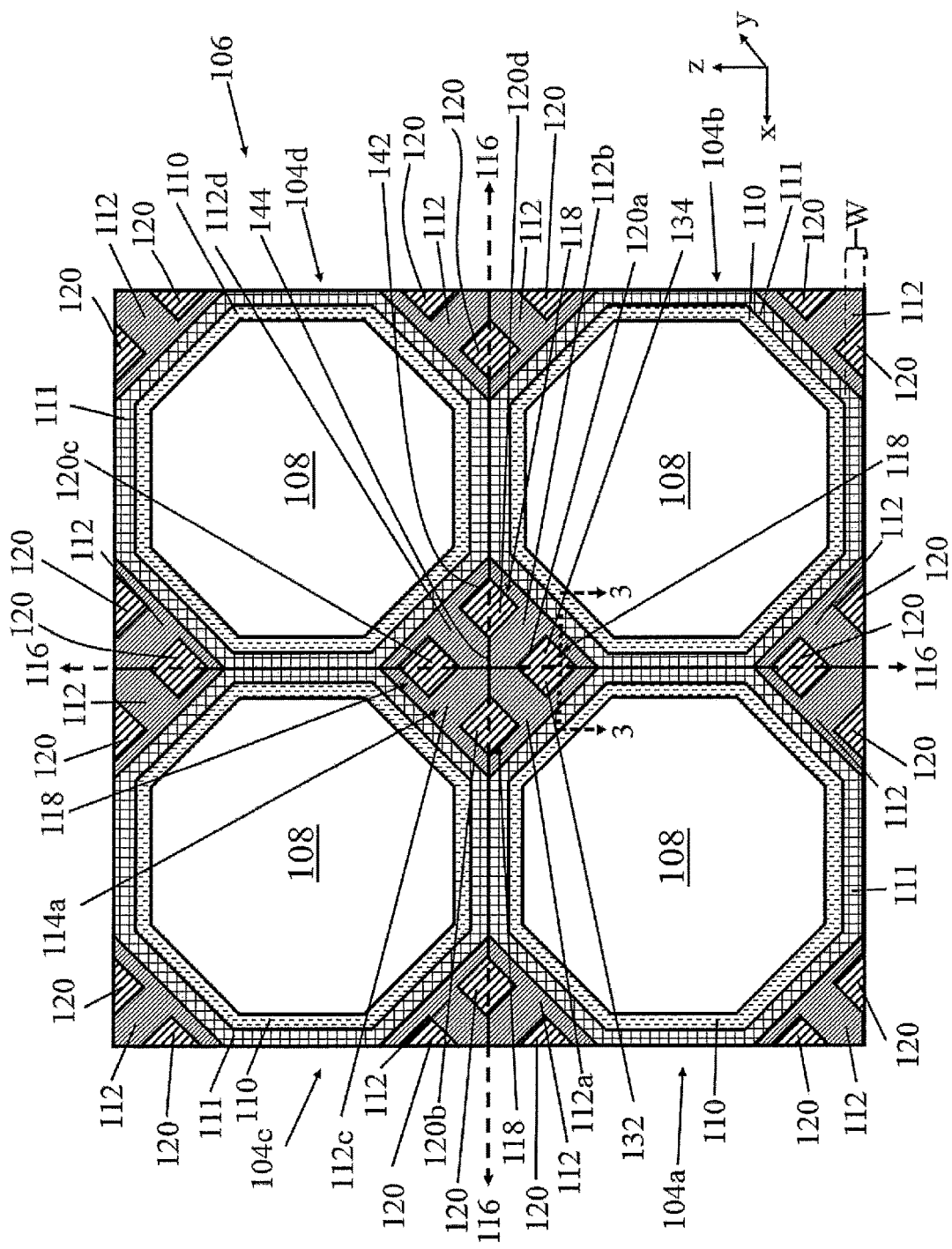
FIG. 2 shows an enlarged plan view of a group of semiconductor chips of FIG. 1, according to embodiments of the disclosure.

Turning now to FIG. 2, an expanded view of four neighboring chips 104a,b,c,d, from the exemplary set of semiconductor chips on wafer 100 is shown (see reference numeral 2 in FIG. 1). FIG. 2 shows an example of a simple version of a reticle field 106. As used herein, the term reticle field may include a region of wafer 100 that contains multiple chips therein and is used to determine whether to print resist material for forming an integrated circuit (IC) for the chips. Although reticle field 106 is shown to contain four chips 104a,b,c,d, reticle field 106 may include approximately 2 to approximately 100,000 chips within approximately a two square centimeter area. Each chip 104 may include an active area 108 including integrated circuit (IC) structures for the semiconductor chip. Active area 108 may include, for example, components such as transistors, memory arrays, and interconnections. Active area 108 and its components may be formed by conventional semiconductor fabrication techniques for forming an active area of a semiconductor chip. Each chip 104 may optionally include a seal ring 110 surrounding active area 108 to protect the IC structures within active area 108 from damage which may be caused during a subsequent wafer dicing process. Seal ring 110 may include a plurality of patterned metal layers, positioned on top of and connected to one another by via structures. As shown in FIG. 2, seal ring 110 may, for example, continuously and completely surround active area 108 of each chip 104. In an example not shown, seal ring 110 may alternatively be slotted, and/or broken. Forming seal ring 110 around active areas 108 with slots may, for example, improve radio frequency (RF) performance of the packaged chip by reducing RF coupling from active area 108 of chip 104 to seal ring 110. Although in the example of FIG. 2 each seal ring 110 is shown to include a substantially octagonal shape, the seal ring may include any desirable geometry for a seal ring. Seal ring 110 may be formed by conventional semiconductor fabrication techniques and materials for forming a seal ring.

As also shown in FIG. 2, each chip 104 may also include chip singulation channels or scribe lanes 111 surrounding active areas 108 for separating the chips from one another after formation and testing. Scribe lanes 111 may include a width W based on the singulation method used, e.g., plasma dicing, mechanical sawing, breaking, etc., which allows for separation of chips 104 without damaging active areas 108. For example, where plasma dicing is used scribe lanes 111 may include a width of approximately 1 to 50 microns per chip 104. As shown in the example of FIG. 2, where each chip 104 includes a seal ring 110, scribe lanes 111 may be formed surrounding and adjacent to seal ring 110. For example, where seal ring 110 includes a substantially octagonal geometry, scribe lanes 111 may also include a substantially octagonal geometry.

As also shown in FIG. 2, each chip 104 may include corner areas 112 positioned outside of seal ring 110. As used herein, the term "corner area" may include a region of each chip 104, outside of seal ring 110 and scribe lanes 111 where two or more edges of the chip would meet if the chips were separated from one another by X-Y grid-like dicing of wafer 100 (FIG. 1) along lines 116. For example, corner areas 112a,b,c,d, which would be formed by dicing along lines 116 (in phantom). Each chip 104 may include, for example, four substantially triangular shaped corner areas 112 as a result of the pattern of seal ring 110. As also shown in FIG. 2, as a result of the layout of chips 104 of wafer 100 (FIG. 1) in reticle field 106, corner areas 112a,b,c,d of each group of neighboring chips may connect to form a corner region 114a. Although not shown, in the example of reticle field 106, other corner areas 112 of chips 104 may connect to form additional corner regions on wafer 100 (FIG. 1). Wafer 100 (FIG. 1) may include any number of corner regions (e.g., corner regions 114a) based on the number of chips 104 on the wafer.

In the example of FIG. 2, corner areas 112 are depicted as "chamfered" corners. Chamfered corner areas may be formed to mitigate and/or prevent cracks and delamination damage during dicing of wafer 100 (FIG. 1) to separate chips 104 from one another. As used herein, the term "chamfered" may refer to a transitional edge between two faces (sides) of an object (e.g., seal ring 110), the transitional edge being, for example, 45 degrees, although any corner chamfer including a curved corner may be used. In the example of FIG. 2, corner areas 112 may be chamfered by conventional semiconductor corner chamfering techniques. For example, corner areas 112 may be chamfered after the fabrication of chips 104 by patterned etching of corner areas, e.g., by RIE using a mask (not shown). Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g., silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches.

Referring now to FIGS. 2-6 together, in contrast to conventional corner regions, corner regions (e.g., corner regions 114a, 114b, 114c, etc.) of wafer 100 (FIG. 1) may be formed to include a test structure disposed therein and extending between multiple corner areas 112 thereof, according to embodiments of the disclosure. The test structure may be formed, for example, to extend between as few as two corner areas 112 and as many as all corner areas 112 within a given corner region (e.g., corner regions 114a, 114b, 114c, etc.).

Forming the test structure to extend between multiple corner areas 112 may, for example, allow for more representative test structures to be formed, and/or allow for test structures to be formed that would not conventionally fit within a single corner area 112. For example, if a test structure including a via chain (e.g., consisting of a first level of wiring; a level vias above the first level of wiring; and second level of wiring above the level of vias) is desired, combining together multiple chip corners for the test structure may allow for an increased number of vias and probe pads for testing. In another non-limiting example, combining together multiple chip corners may further allow for two interpenetrating via chains wired to four probe pads to be formed within a corner region (e.g., corner region 114b), which may allow for testing each chain for continuity and resistance, and testing for electrical shorts between the two via chains. As will be described further, the test structure may include, for example, an electronic test structure or an optical test structure. As used herein, the term "electronic test structure" may include a semiconductor test structure for testing an electronic property, e.g., resistance, of components of semiconductor chips 104 of wafer 100 (FIG. 1). As used herein, the term "optical test structure" may include a semiconductor test structure for testing optical characteristics, e.g., critical dimensions, of components of semiconductor chips 104 of wafer 100 (FIG. 1). In another non-limiting example, both an electronic test structure and an optical test structure may be formed within a single corner region (e.g., corner region 114c of FIG. 6) of wafer 100 (FIG. 1).

Figure 3:
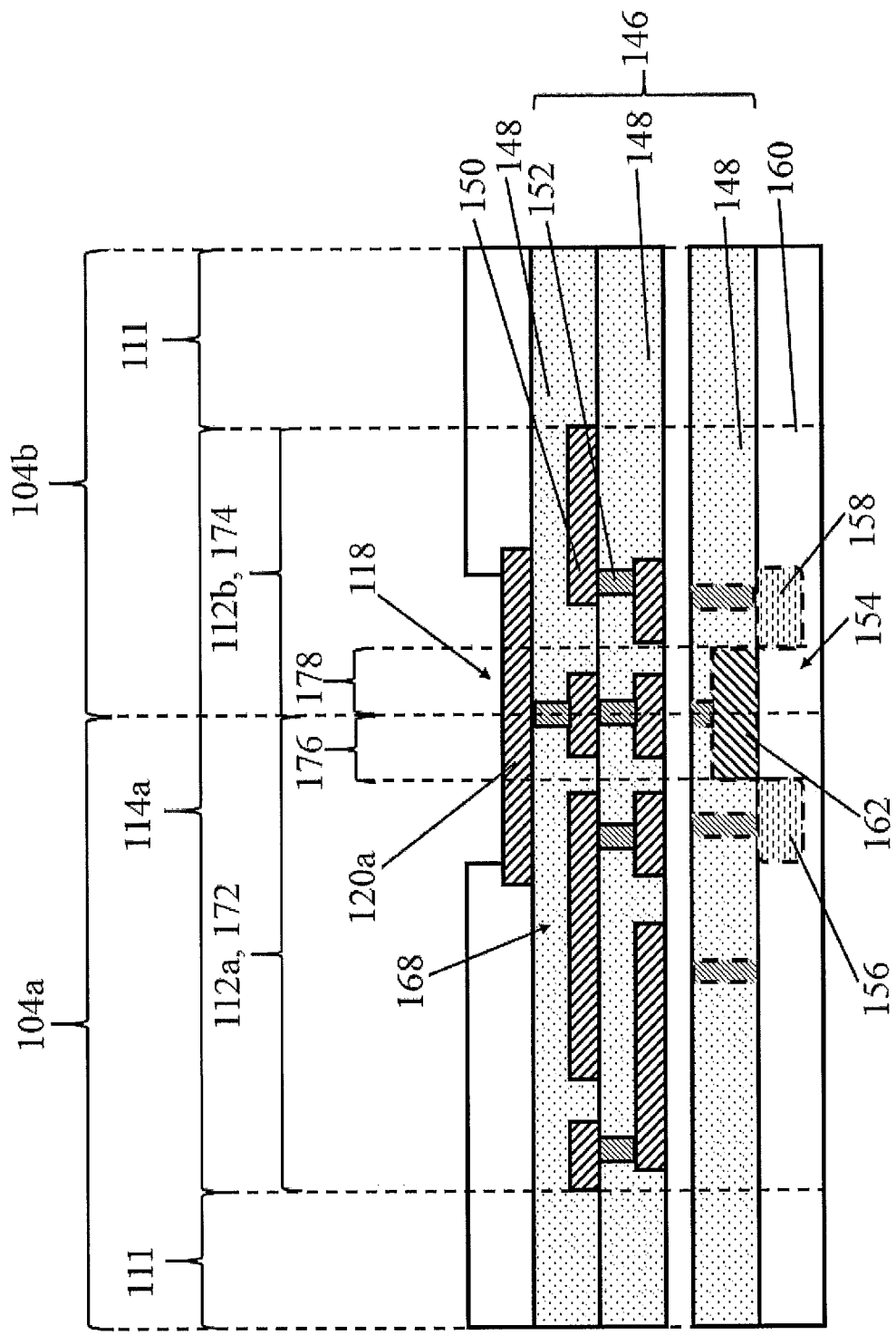
FIG. 3 shows a cross-sectional view of a corner region of the group of semiconductor chips of FIG. 2, according to embodiments of the disclosure.

Referring to FIGS. 2 and 3 together, an example of an electronic test structure 118 formed within a corner region 114a of wafer 100 (FIG. 1) according to embodiments of the disclosure is shown. Electronic test structures such as electronic test structure 118 may be formed on wafer 100 (FIG. 1), for example, to test the electrical properties (e.g., resistances, open, close, etc.) of chips 104 to ensure the quality of the chips. Electronic test structure 118 may be formed within corner region 114a as extending between two or more of corner areas 112a,b,c,d, shown in FIG. 2. Electronic test structure 118 may include any desirable electronic test structure for testing chips 104 of wafer 100 (FIG. 1). As shown in the example of FIGS. 2 and 3, electronic test structure 118 may include an electronic test structure for testing field effect (FET) transistors of chips 104 of wafer 100 (FIG. 1).

Turning to FIG. 2, an electronic test structure 118 may include probe pads 120a,b,c,d exposed within corner region 114a. Probe pads 120 may, for example, allow electrical access to semiconductor devices of active area 108 of each chip 104 connected therebelow for testing. For example, electrical measurements may be made across the probe pads. Although electronic test structure 118 is shown to include four probe pads 120a,b,c,d, electronic test structure 118 may include any desirable number of probe pads in corner region 114a.

Each probe pad 120a,b,c,d may be formed, for example, to extend across multiple corner areas 112 of chips 104 in corner region 114a. For example, as shown in FIG. 2, probe pad 120a may be formed across corner areas 112a and 112b of chips 104a, and 104b, respectively, such that a first portion 132 of probe pad 120a is positioned within corner area 112a, and a second portion 134 of probe pad 120a is positioned within corner area 112b. Forming probe pads 120a,b,c,d across multiple corner areas 112 may, for example, allow for more test pads to be formed than if a single corner was used to place the test pads. For example, forming probe pads 120a,b,c,d across multiple corner areas 112 may allow for four probe pads to be formed in corner region 114a for connection to and testing of a source, drain, gate, and body of a field effect transistor (FET) structure.

As also shown in the example of FIG. 2, probe pads 120*a,b,c,d* may be formed at a different orientation in the x-y plane with respect to the orientation of chips 104. For example, probe pads 120*a,b,c,d* may be formed at an angle of approximately 1 degree to approximately 45 degrees as measured between a side 142 of probe pad 120*d*, and a side 144 of corner area 112*d* of chip 104*d*. Forming probe pads 120 at an angle with respect to the orientation of chips 104 may, for example, allow for spacing of the probe pads so that a larger number of probe pads may be formed in corner region 114*a* for testing. Forming probe pads 120 at an angle may also allow for more space between the probe pads to mitigate and/or prevent misprobing the probe pads during testing. Probe pads 120 of corner region 114*a* may be tested, for example, using a probe card and/or by raster scan for testing each of chips 104 in reticle field 106. Due to the different orientation of probe pads 120*a,b,c,d* with respect to the orientation of chips 104, testing of chips 104, e.g., by raster scan, may be performed at an angle with respect to chips 104. For example, where probe pads 120*a,b,c,d* are at an angle of 45 degrees as shown in the example of FIG. 2, testing could be performed on all corner areas 112 of reticle field 106 in a 45 degree raster pattern.

Probe pads 120*a,b,c,d* may be formed on corner areas 112 by conventional semiconductor fabrication techniques and materials for forming probe pads. For example, probe pads 120 may be formed by patterned etching of trenches within corner areas 112 and deposition of probe pad material (e.g., aluminum (Al)) therein. As used herein, "deposition" or "depositing" a material may include any now known or later developed technique appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation, in addition to other deposition processes currently known or later developed.

Turning to FIG. 3, a cross-sectional view of corner region 114*a* including example electronic test structure 118 along line 3-3 of FIG. 2 is shown. Electronic test structure 118 may further include an interconnect structure 146 for connecting probe pads 120*a,b,c,d* to semiconductor devices of chips 104 for testing. Interconnect structure 146 may connect as few as one and as many as all probe pads 120*a,b,c,d* in corner region 114*a*. In the example of FIG. 3, interconnect structure 146 may connect all four probe pads 120*a,b,c,d* to semiconductor devices of chips 104, e.g., components of a field effect transistor (FET) 154 (in phantom) of semiconductor chip 104*a*. In another non-limiting example not shown, corner region 114*a* may include two electronic test structures each including an interconnect structure extending between two corner areas 112 of corner region 114*a* each connecting two probe pads 120 to semiconductor structures of the chips of wafer 100 (FIG. 1) for testing. Interconnect structure 146 may include a group of insulator material layers 148 providing different amounts of electrical insulation. Interconnect structure 146 may include any desirable number of insulator material layers 148 for chips 104 of wafer 100 (FIG. 1). For example, insulator material layers 148 may be formed as a group of insulating layers, each of which can be separately processed to include trenches, cavities, etc. As shown in FIG. 3, insulator material layers 148 may each include a plurality of stacked metal wires 150 and vias 152 formed therein for providing electrical connections between semiconductor structures of chips 104 for testing via electronic test structure 118. Interconnect structure 146 may be formed by conventional semiconductor fabrication techniques and materials for forming an interconnect structure of an electronic test structure. For example, interconnect structure 146 may be formed by cyclic steps of deposition of insulator material, patterned etching of the insulator material, and deposition and planarizing of materials (e.g., copper (Cu)) for vias and metal wires.

FIG. 3 also shows a cross-sectional view of portions of scribe lanes 111 of chips 104*a* and 104*b*. As shown in the example of FIG. 3, scribe lanes 111 may, for example, be absent of wires, vias, silicide and/or any other metal structures. Although not shown in the example of FIG. 3, scribe lanes 111 may contain (e.g., vias, wires, silicide, etc.) and/or non-metal structures which can be removed during chip singulation. Whether scribe lanes 111 may be formed to contain metal structures may depend on which singulation method will be used to separate the chips. For example, where plasma dicing is used to separate the chips, it may be undesirable for scribe lanes 111 to include metal structures.

As discussed above, some embodiments of electronic test structure 118, i.e., the example of FIGS. 2 and 3, may include probe pads 120*a,b,c,d*, and an interconnect structure 146 for connecting the probe pads to field effect transistors (FETs) of chips 104 of wafer 100 (FIG. 1) for testing. As shown in FIG. 3, interconnect structure 146 of electronic test structure 118 may electrically connect probe pads 120*a,b,c,d* to components of FETs of chips 104 (e.g., FET 154 (in phantom) of chip 104*a*) for testing the FETs.

FET 154 (in phantom) may be formed on upper surface 102 (FIG. 1) of wafer 100 (FIG. 1). For example, FET 154 (in phantom) may be a FET of chip 104*a*, formed within active area 108 thereof. Although not shown, FET 154 may alternatively or additionally be formed within one, two, three, or four corner areas 112 of a corner region (e.g., corner region 114*a*). FET 154 (in phantom) may include, for example, a source 156 and drain 158 formed within a substrate 160 formed on upper surface 102 of wafer 100 (FIG. 1). FET 154 (in phantom) may also include a gate 162 formed on substrate 160. Although not described in detail herein, FET 154 (in phantom) may include a conventional FET structure formed by conventional semiconductor fabrication techniques and materials for forming a FET on a wafer.

As best shown in the cross-section of FIG. 3, interconnect structure 146 of electronic test structure 118 may include wires 150 and vias 152 connecting probe pads 120*a,b,c,d* to gate 162, source 156, drain 158 and substrate 160 of FET 154 (in phantom) for electronic testing. For example, wires 150 and vias 152 may extend from corner region 114*a* into active area 108 of the chips 104 to connect probe pads 120*a,b,c,d* to FETs (e.g., FET 154, in phantom) therein. For example, interconnect structure 146 of electronic test structure 118 may include wires/vias connecting gate 162 to probe pad 120*a*; wires/vias connecting substrate 160 to probe pad 120*b* (FIG. 2); wires/vias connecting source 156 to probe pad 120*c* (FIG. 2); and wires/vias connecting drain 158 to probe pad 120*d* (FIG. 2).

As discussed above, and as best shown in the cross-sectional view of FIG. 3, electronic test structure 118 may extend within corner region 114*a* between at least two corner areas 112a,b. For example, a first portion 172 of electronic test structure 118 may be disposed within corner area 112a, and a second portion 174 of electronic test structure 118 may be disposed within corner areas 112b. As shown in FIG. 3, for example, first portion 172 may include at least a portion 176 of wires 150, vias 152 and a respective portion of probe pad 120a within corner area 112a. Second portion 174 may include at least a portion 178 of chain 164, chain 170, and a respective portion of probe pad 120a within corner area 112b. Portions of chains 164, 166, 168, 170 of interconnect structure 146 may also extend into and/or out of the page of FIG. 3 between corner areas 112c and 112d (FIG. 2) of chips 104c and 104d (FIG. 2), respectively.

Although an electronic test structure 118 for testing FETs of chips 104 of wafer 100 (FIG. 1) is shown in the example of FIGS. 2 and 3, any electronic test structure may be formed within corner region 114a and extending between multiple corner areas 112, according to embodiments of the disclosure. In another non-limiting example not shown, electronic test structure 118 may include structures (e.g., interconnects) for testing resistance, shorts, and opens of semiconductor structures (e.g., metal wires) of chips 104. Additionally, although one electronic test structure 118 is shown disposed within corner region 114a in the example of FIGS. 2 and 3, corner areas 112 of wafer 100 (FIG. 1) may include more than one test structure therein. In a non-limiting example not shown, a corner area may include a first electronic test structure disposed therein and extending between two corners thereof, and a second electronic test structure disposed therein and extending between a different two corners thereof.

Figure 4:
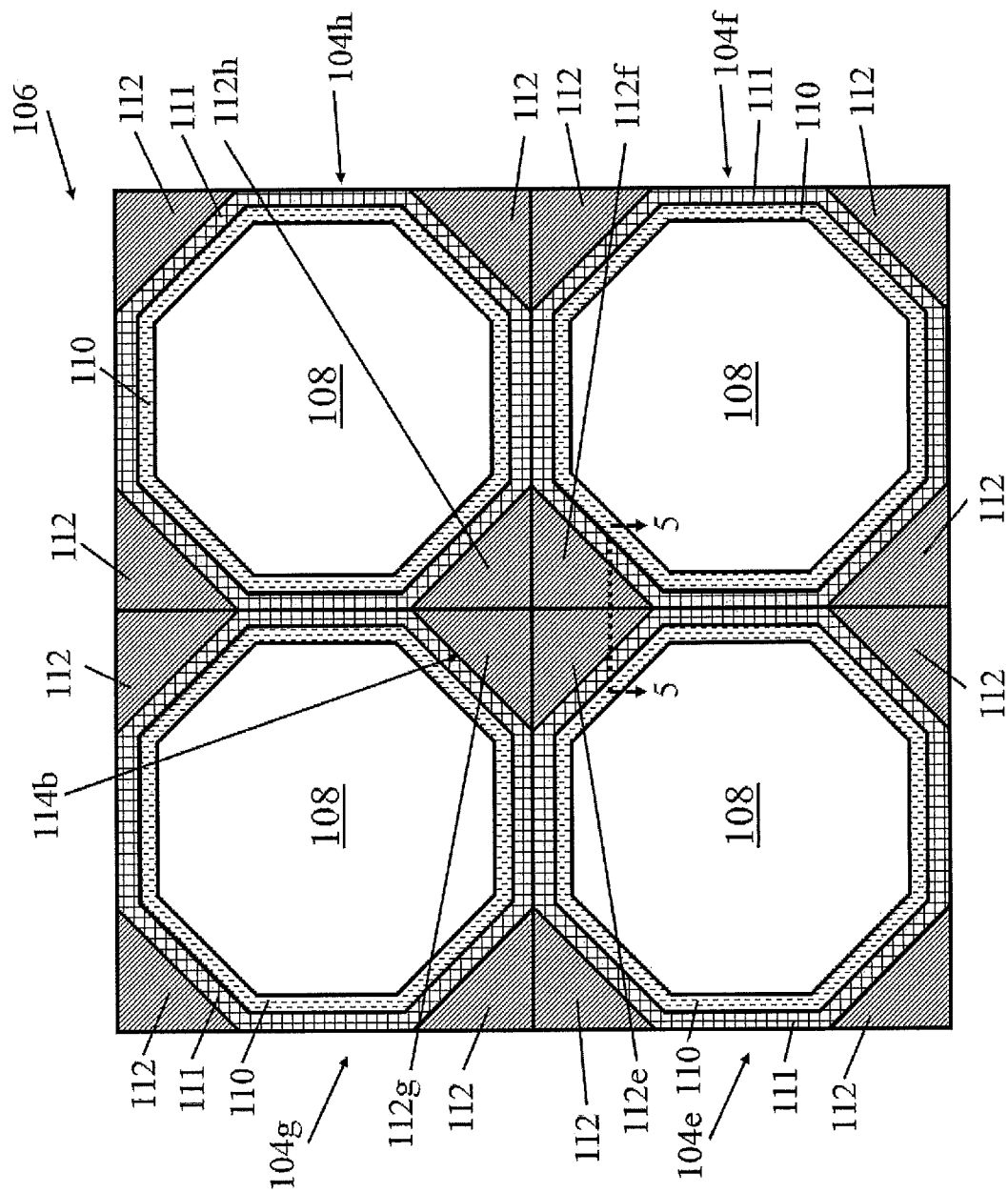
FIG. 4 shows an enlarged plan view of a group of semiconductor chips on the wafer of FIG. 1, according to embodiments of the disclosure.
Figure 5:
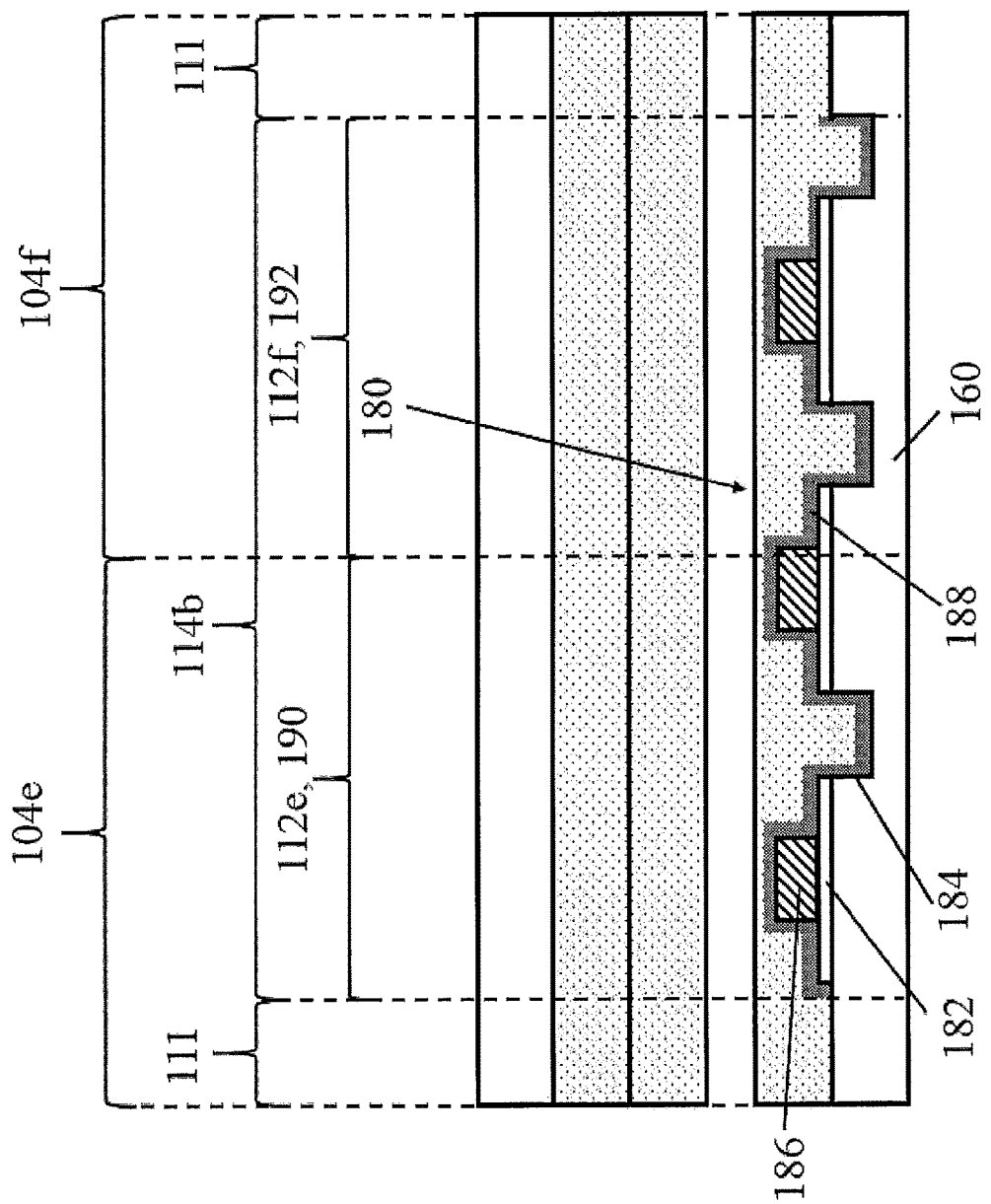
FIG. 5 shows a cross-sectional view of a corner region of the group of semiconductor chips of FIG. 4, according to embodiments of the disclosure.
Figure 6:
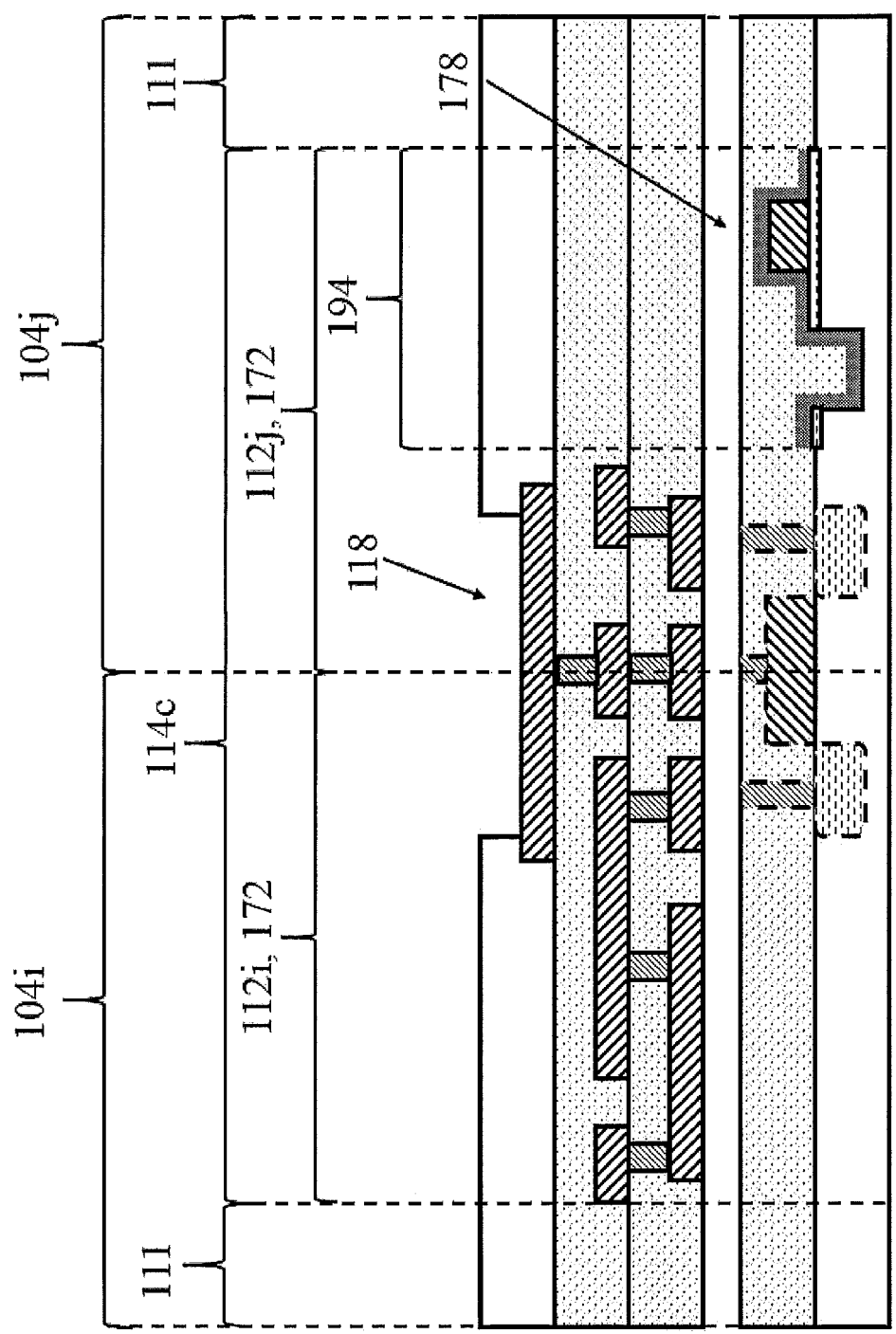
FIG. 6 shows a cross-sectional view of a corner region of a group of semiconductor chips of FIG. 1, according to embodiments of the disclosure.

Turning now to FIGS. 4-6 together, the test structure formed within corner regions (e.g., corner regions 114b, 114c, etc.) of wafer 100 (FIG. 1) may include optical test structures formed to extend across as few as one and as many as all corner areas 112 of the corner region. Optical test structures may be formed within corner regions (e.g., corner regions 114b, 114c, etc.) in the alternative or in addition to electronic test structures as described above. The optical test structures may include any optical test structures desirable for testing chips 104 of wafer 100 (FIG. 1). For example, optical test structures may be formed for aligning and measuring the X-Y, and radial registration of a photo mask to a prior level on wafer 100 (FIG. 1). In another non-limiting example, optical test structures may be formed for testing optical wave guides, etc. associated with optical integrated circuits (ICs).

Referring to FIGS. 4 and 5 together, a single optical test structure for measuring alignment is shown disposed within a corner region and extending between multiple corner areas thereof. FIG. 4 shows an enlarged plan view of four neighboring chips 104e,f,g,h from the exemplary set of chips on wafer 100 shown in FIG. 1 (see reference numeral 4). As shown in FIG. 4, chips 104e,f,g,h may each include active areas 108 surrounded and protected by seal rings 110. Chips 104e,f,g,h may also each include corner areas 112. As a result of the layout of chips 104e,f,g,h, corner areas 112e,f, g,h, may form a corner region 114b. As will be discussed herein with respect to FIG. 5, corner region 114b may include an optical test structure 180 formed therein, according to embodiments of the disclosure. Components of chips 104e,f,g,h including similar numbering with respect to chips 104a,b,c,d described above with respect to FIGS. 1 and 2 may indicate those components as being formed by similar and/or the same fabrication techniques and/or materials.

FIG. 5 shows a cross-sectional view of corner region 114b between scribe lanes 111 of chips 104e and 104b at line 5-5 of FIG. 4. As shown in the cross-sectional view, corner region 114b may include optical test structure 180 disposed therein. Optical test structure 180 may include a conventional alignment test structure, for example, for lithographic alignment and registration of X-Y, and radial alignment to a prior level on wafer 100 (FIG. 1). In the example of FIG. 5, optical test structure 180 may allow for alignment of wafer 100 (FIG. 1) by generating a light incident to the wafer and detecting the light as it is reflected off of optical test structure 180. In another example not shown, optical test structure 180 may allow for a field effect transistor (FET) gate level to be aligned to optical test structure 180, such as to trench 184. Another example not shown may include aligning a wire to a portion of optical test structure 180 therebelow, including a wire or via, e.g., mask pattern 186.

Optical test structure 180 may be formed by conventional semiconductor fabrication techniques and materials for forming an alignment test structure. For example, the optical test structure 180 shown in the example of FIG. 5 may be formed by: deposition and patterned etching of a silicon nitride mask 182 on substrate 160 on wafer 100 (FIG. 1); patterned etching of substrate 160 using mask 182 to form trenches 184; deposition of material for mark patterns, such as silicon oxide; patterned etching of the mark material to form mark patterns 186; and deposition of a silicon oxide layer 188 thereon.

Optical test structure 180 may be formed within corner region 114b to extend within, for example, as few as two corner areas 112 thereof and as many as all corner areas 112 thereof. For example, optical test structure 180 may include a first portion 190 extending within corner area 112e, and a second portion 192 extending within corner area 112f. Optical test structure 178 may also, for example, extend into and out of the page of FIG. 5 between additional corner areas 112 (e.g., corner areas 112g and 112h of FIG. 4) of corner region 114b. As discussed above, although an optical test structure 178 for testing alignment of structures of chips 104 of wafer 100 (FIG. 1) is shown, any optical test structure may be formed within corner region 114b and extending between multiple corner areas 112, according to embodiments of the disclosure. Additionally, although one optical test structure 180 is shown disposed within corner region 114b in the example of FIGS. 4 and 5, corner region 114b of wafer 100 (FIG. 1) may include more than one test structure therein. In a non-limiting example not shown, a corner area may include a first optical test structure disposed therein and extending between two corners thereof, and a second optical test structure disposed therein and extending between a different two corners thereof.

Referring now to FIG. 6, in some embodiments, a corner region (e.g., corner region 114c) of wafer 100 (FIG. 1) may be formed to include both electronic test structures and optical test structures disposed therein and extending between multiple corner areas 112 thereof. Forming both electronic test structures and optical test structures within the same corner region such as corner region 114c may, for example, allow for increased area on wafer 100 (FIG. 1) for functional chips. FIG. 6 shows a cross-sectional view of another corner region 114c of wafer 100 (FIG. 1) between scribe lanes 111 of chips 104i and 104j, respectively. Corner region 114c may include, for example, both electronic test structure 118 and optical test structure 178 therein, according to embodiments of the disclosure. Corner region 114c may include corner areas 112i and 112j of chips 104i and 104j, respectively. Corner region 114c may include electronic test structure 118, discussed above with respect to FIGS. 2-3 disposed therein. For example, first portion 172 of electronic test structure 118 may be positioned within corner area 112*i*, and second portion 174 of electronic test structure 118 may be positioned within corner areas 112*j*. Similarly as described above with respect to FIG. 3, electronic test structure 118 may, for example, include portions thereof extending into and/or out of the page of FIG. 6 within additional corner areas (not shown) of corner region 114*c*.

As also shown in FIG. 6, corner region 114*c* may further include, for example, optical test structure 180, discussed above with respect to FIGS. 4 and 5, disposed therein. For example, a portion 194 of optical test structure 180 may be positioned within corner area 112*j*. Although not shown in the cross-sectional view of FIG. 6, optical test structure 178 may extend into and/or out of the page of FIG. 6 and within additional corner areas (not shown) of corner region 114*c*.

Structures shown in FIG. 6 including similar numbering with respect to structures described above with respect to FIGS. 1-5 may indicate the structures as being formed by similar and/or the same fabrication techniques and/or materials. Although optical test structure 180 and electronic test structure 118 are shown in a particular number and layout in FIG. 6, any number of optical test structures and electronic test structures may be formed within a corner region (e.g., corner region 114*c*) of wafer 100 (FIG. 1). In a non-limiting example not shown, corner region 114*c* may include a first electronic test structure positioned within two corner areas 112 of a corner region 114*c*, a second electronic test structure positioned within a different two corner areas 112 of the corner region 114*c*, and an optical test structure positioned within one or more of the corner areas 112 of that corner region.

Forming test structures such as electronic test structure 118 and/or optical test structure 178 within corner regions (e.g., corner region 114*a*, 114*b*, 114*c*, etc.) of wafer 100 (FIG. 1) as discussed above with respect to FIGS. 2-6 may, for example, utilize otherwise vacant space on wafer 100 (FIG. 1). Forming test structures according to embodiments of the disclosure may also therefore reduce the amount of "knockout" space on wafer 100 (FIG. 1) required for semiconductor test structures, and therefore increase the number of chips which may be formed on the wafer. Forming test structures such as electronic test structure 118 and/or optical test structure 178 such that portions of the test structures extend between multiple corner areas 112 of a respective corner region (e.g., corner region 114*a*, 114*b*, 114*c*, etc.) may, for example, allow for more area to fit in complex structures, as discussed previously, or allow for more reticle field area for active functional chips.

Figure 7:
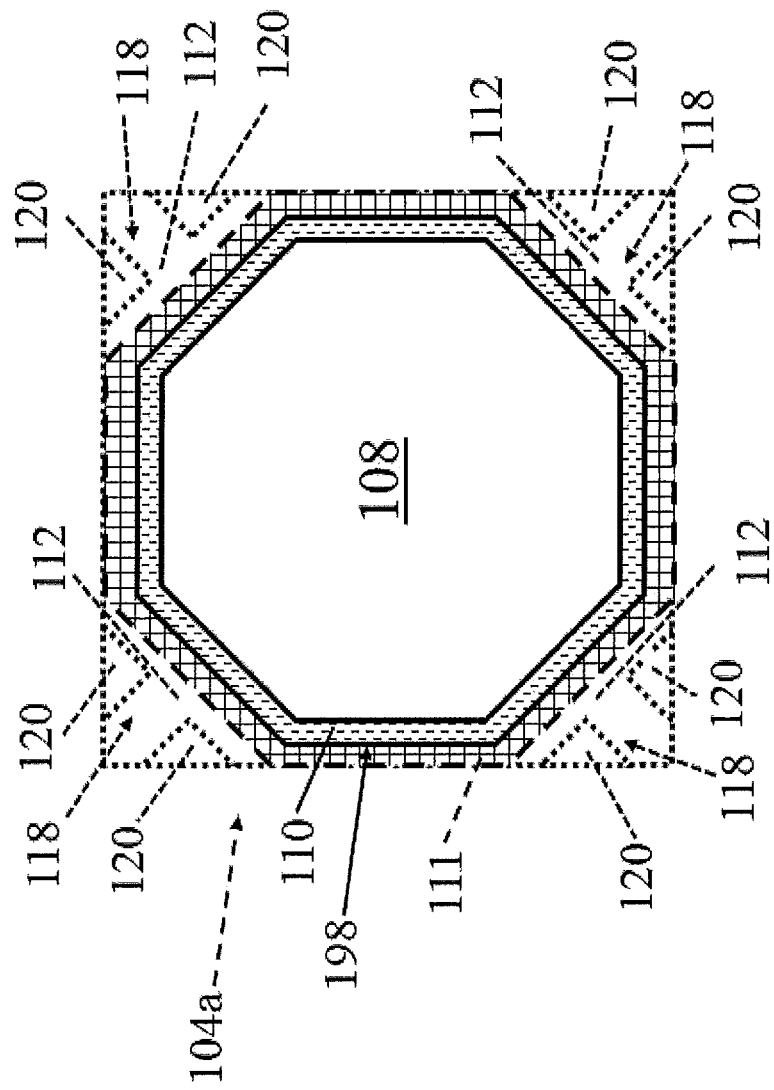
FIG. 7 shows an enlarged plan view of a group of semiconductor chips of FIG. 1 after separation of the semiconductor chips, according to embodiments of the disclosure.

Referring to FIG. 7, after testing chips 104 (FIG. 1) using the electronic test structures and/or optical test structures formed according to embodiments of the disclosure, the chips may be separated from one another to form individual semiconductor chips, e.g. chip 198. FIG. 7 shows an enlarged plan view of an individual chip 198 formed from chip 104*a* (in phantom) of wafer 100 of FIG. 1 after separation of the chips. Chips 104 (FIG. 2) may be separated from one another by the dicing of wafer 100 (FIG. 1). The dicing of wafer 100 (FIG. 1) to form individual semiconductor chips e.g., chip 198, may include dicing along scribe lane 111 (in phantom). Wafer 100 (FIG. 1) may be diced scribe lane 111 (phantom), for example, by a plasma dicing process, during which the chips are singulated along the scribe lane. As shown in FIG. 7, dicing wafer 100 (FIG. 1) along scribe lane 111 (in phantom) may, for example, remove corner areas 112 (in phantom) from chip 104*a* (in phantom), the corner areas including test structures therein (e.g., electronic test structures including probe pads 120, in phantom). Individual semiconductor chip 198 may include active area 108, and seal ring 110 surrounding and protecting active area 108, as described above with respect to FIG. 2. As also shown in FIG. 7, dicing wafer 100 (FIG. 1) along scribe lanes 111 (FIGS. 2 and 4, in phantom) may result in individual semiconductor chips, e.g., chip 198, including a substantially octagonal geometry. Removing corner areas 112 including test structures according to embodiments of the disclosure may, for example, allow for an octagonal shaped chip.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s). "Substantially octagonal" may refer to a shape having eight major sized but with some variation in the shape of the sides of the number of additional minor sides provided. "Substantially triangular" may refer to a shape having three major sized but with some variation in the shape of the sides of the number of additional minor sides provided.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A semiconductor wafer comprising a plurality of semiconductor chips, wherein each semiconductor chip comprises:
   an active area including a plurality of integrated circuit (IC) structures;
   a chamfered corner area of the semiconductor chip that is outside of the active area; and
   a portion of a test structure disposed within the chamfered corner area, wherein the portion of the test structure is configured to contact at least one other portion of the test structure disposed in another chamfered corner area of another semiconductor chip of the semiconductor wafer to form the test structure, wherein the test structure includes a via chain;
   wherein the test structure is an electronic test structure and includes a plurality of probe pads in the chamfered corner area of the semiconductor chip, wherein at least one probe pad of the plurality of probe pads includes a first portion positioned within the corner area of the semiconductor chip and a second portion positioned within the another chamfered corner area of the another semiconductor chip.

2. The semiconductor wafer of claim 1, wherein the test structure includes two portions from two semiconductor chips of the plurality of semiconductor chips.

3. The semiconductor wafer of claim 1, wherein each semiconductor chip of the plurality of semiconductor chips includes a scribe lane surrounding the active area.

4. The semiconductor wafer of claim 1, wherein a side of the at least one probe pad is formed at an angle of approximately 1 degree to approximately 45 degrees with respect to a side of the corner area in which it is positioned.

5. The semiconductor wafer of claim 1, wherein the each semiconductor chip further comprises a seal ring positioned between the active area and the corner area.

6. A semiconductor chip comprising:
   an active area including a plurality of integrated circuit (IC) structures;
   a chamfered corner area of the semiconductor chip that is outside of the active area;
   a test structure including a via chain, wherein a portion of the test structure is disposed within the chamfered corner area, wherein the portion of the test structure contacts another portion of the test structure disposed within another chamfered corner area of another semiconductor chip to form a test structure, prior to separation of the semiconductor chips; and
   a plurality of probe pads in the chamfered corner area of the semiconductor chip, wherein at least one of the plurality of probe pads is positioned on an uppermost surface of the chamfered corner area, and wherein a portion of the at least one probe pad is integral with another portion of the at least probe pad positioned on the another chamfered corner area of the another semiconductor chip to form the at least probe pad prior to separation of the semiconductor chips.

7. The semiconductor chip of claim 6, wherein the test structure is one of an electronic test structure, and an optical test structure.

* * * * *